United States Patent [19]
Morimoto et al.

[11] Patent Number: 4,819,245
[45] Date of Patent: Apr. 4, 1989

[54] SEMICONDUCTOR LASER DEVICE HAVING SUBSTRIPED CHANNELS FOR FORMING AN ACTIVE LAYER WHICH IS THIN IN AN INSIDE PORTION

[75] Inventors: Taiji Morimoto; Mototaka Taneya, both of Nara; Hiroshi Hayashi, Kyoto; Saburo Yamamoto, Nara, all of Japan

[73] Assignee: Sharp Kabushiki Kaisha, Japan

[21] Appl. No.: 854,627

[22] Filed: Apr. 22, 1986

[30] Foreign Application Priority Data

| Apr. 23, 1985 | [JP] | Japan | 60-87881 |
| Apr. 24, 1985 | [JP] | Japan | 60-90400 |
| Jul. 22, 1985 | [JP] | Japan | 60-163221 |
| Jul. 23, 1985 | [JP] | Japan | 60-163394 |
| Jul. 23, 1985 | [JP] | Japan | 60-163399 |

[51] Int. Cl.$^4$ .............................................. H01S 3/19
[52] U.S. Cl. ...................................... 372/48; 372/45; 372/46
[58] Field of Search .................... 372/44, 45, 46, 48

[56] References Cited

U.S. PATENT DOCUMENTS 4,523,317  6/1985  Botez ...................................... 372/45

FOREIGN PATENT DOCUMENTS 1150388  7/1983  Canada .................................. 372/48

Primary Examiner—James W. Davie
Attorney, Agent, or Firm—Armstrong, Nikaido, Marmelstein & Kubovcik

[57] ABSTRACT

A semiconductor laser device comprises a substrate having a main striped channel for confining current therein and sub-striped channels formed in a parallel manner outside of the main striped channel. The width of the sub-striped channels is greater than that of the main striped channel. An active layer is provided for laser oscillation. The portion of the active layer corresponding to the sub-striped channels are formed into a concave portion. The portion of the active layer positioned between the concaved portions of the active layer results in a plane with a limited thickness.

7 Claims, 14 Drawing Sheets

SEMICONDUCTOR LASER DEVICE HAVING SUBSTRIPED CHANNELS FOR FORMING AN ACTIVE LAYER WHICH IS THIN IN AN INSIDE PORTION

BACKGROUND OF THE INVENTION

1. Field of the invention:

This invention relates to a semiconductor laser device having a thin active layer for laser oscillation, the thickness of which is carefully controlled in a liquid phase epitaxial growth process, thereby attaining a high output power operation.

2. Description of the prior art:

In order to achieve continuously stable laser oscillation in a single mode at a low threshold current level, semiconductor laser devices have been designed in a manner to define the active layer by cladding layers, and moreover to confine light and carriers with a high density within the laser oscillation area of the active layer by means of a current-confining striped structure and a waveguide structure. However, when the semiconductor laser devices operate at a high output power, the density of light in the active layer is increased, resulting in heat deterioration of the devices. To resolve this problem, TRS (a high-power, single-mode laser with twin-ridge-substrate structure) lasers have been proposed (Appl. Phys. Lett., vol. 42, No. 10, 15th May, 1983, p. 853) in which a thin active layer is formed to decrease the light density of the active layer thereby attaining high output power operation. The thin active layer is grown on the ridges of the base layer by liquid phase epitaxy. However, the growth of an active layer having a thickness of as thin as 0.1 $\mu$m or less using liquid phase epitaxy is extremely difficult. The output intensity of laser light depends upon the thickness of the active layer, and as the thickness of the active layer is decreased, the carrier density of the active layer increases resulting in a state for laser oscillation at a high output power at a low current level. However, even though a thin active layer is grown on the ridges of the base layer and accordingly a decrease in the light density thereof is achieved, the absorption of laser light at or around the facets does not decrease, causing damage and/or deterioration of the facets, which shortens the life time of these TRS lasers.

On the other hand, window VSIS lasers have been proposed (Appl. Phys. Lett., vol. 42, No. 5, 1st May, 1983, p. 406) in which a thick and concaved active layer is used in the stimulated region inside of the facets and a thin and flat active layer is used in the window regions in the vicinity of the facets to thereby decrease the absorption of laser light at or near the facets, so that a high output power operation can be attained. However, so long as the growth of the active layer is carried out using a common liquid phase epitaxial growth technique, the curvature of the active layer in the light stimulated region cannot be controlled within a fixed limit due to problems such as the saturation of the Ga solution and/or of the temperature distribution within the growth furnace. Thus, semiconductor laser devices having uniform characteristics cannot be mass-produced with reliability. Moreover, the application of such a concaved active layer to the devices results in an increase in part in the light density of the concaved active layer with relation to the refractive index of the active layer, causing deterioration of the devices at high output power operation.

SUMMARY OF THE INVENTION

The semiconductor laser device of this invention, which overcomes the above-discussed and numerous other disadvantages and deficiencies of the prior art, comprises a substrate having a main striped channel for confining current therein and sub-striped channels formed in a parallel manner outside of said main striped channel. The width of the sub-striped channels is greater than that of the main striped channel. An active layer is provided for laser oscillation. The portions of the active layer corresponding to the sub-striped channels are formed into a concave portion. The portion of the active layer positioned between the concaved portions of the active layer results in a plane with a limited thickness.

The thickness of the portion of the active layer positioned between the concaved portions of the active layer is, in a preferred embodiment, thinner than that of the other portion of the active layer.

The thickness of the portions of the active layer corresponding to the main striped channel in the vicinity of the facets is, in a preferred embodiment, thinner than that of the portion of the active layer corresponding to the main striped channel inside of the facets. In a more preferred embodiment the sub-striped channels are formed in the direction of laser oscillation along the whole length of the main striped channel. The distance between the main striped channel and each of the sub-striped channels in the vicinity of the facets is smaller than that between the main striped channel and each of the sub-striped channels inside of the facets. Alternatively, the sub-striped channels are formed in the direction of laser oscillation along the main striped channel only in the vicinity of the facets.

The width of each of the sub-striped channels is, in a preferred embodiment, wider in the vicinity of the facets than that of each of the sub-striped channels inside of the facets.

The depth of each of the sub-striped channels is, in a preferred embodiment, deeper in the vicinity of the facets than that of each of the sub-striped channels inside of the facets.

The portion of the active layer in the vicinity of each of the facets is, in a preferred embodiment, a window region functioning as an optical waveguide.

Thus, the invention described herein makes possible the objects of (1) providing a semiconductor laser device in which the growth of a thin active layer is attained with reproducibility resulting in a high output power semiconductor laser device; (2) providing a semiconductor laser device in which the active layer of the laser oscillation operation area is flat and the thickness of the flat portion of the active layer in the vicinity of the facets is thinner than that of the flat portion of the active layer inside of the facets, so that the absorption of laser light at or around the facets can be suppressed, thereby attaining continuous laser oscillation at a high output power at room temperatures; (3) providing a semiconductor laser device which can oscillate at a high output power and can be produced at an improved yield since the portion of the active layer corresponding to the main striped channel structure is necessarily formed into a flat shape; (4) providing a long life semiconductor laser device having window regions in which the absorption of laser light is minimized, and (5) providing a semiconductor laser device which can be mass-produced with reliability.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Example 1

Figure 1A:
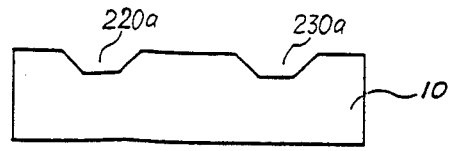
FIGS. 1(A) to 1(E) are sectional side views showing a production process of a semiconductor laser device of this invention.
Figure 1B:
Figure 1C:
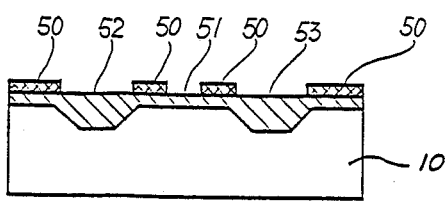
Figure 1D:
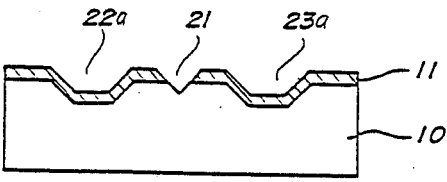
Figure 1E:
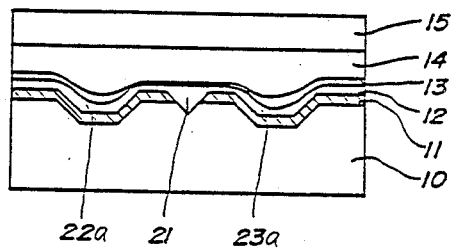

FIGS. 1(A) to 1(E) show the production process of a semiconductor laser device of this invention. As shown in FIG. 1(A), on the growth surface of a Zn-doped p-GaAs substrate ($p=1\times10^{19}cm^{-3}$) 10, striped mesa-channels 220a and 230a having a width of 8 μm and a depth of 1 μm are formed with a distance of 40 μm therebetween by an etching technique. Then, on the GaAs substrate 10 including the striped mesa-channels 220a and 230a, as shown in FIG. 1(B), a Te-doped n-GaAs current blocking layer ($n=6\times10^{18}cm^{-3}$) 11 is grown by liquid phase epitaxy in such a manner that the striped mesa-channels 220a and 230a are filled with the GaAs current blocking layer 11. The layer 11 has a flat surface, the thickness of which is 0.8 μm in the portion corresponding to the flat area of the substrate 10 other than the striped mesa-channels 220a and 230a. This current blocking layer 11 has a polarity different from the polarity of current to be injected. Then, a resist film 50 is formed on the current blocking layer 11, and etched off in part to form stripes 51, 52 and 53, as shown in FIG. 1(C). Etching then forms a main striped channel (the width thereof being 3 μm and the depth thereof being 1 μm) 21 into a V-shape in the portion corresponding to the stripe 51 and sub-striped channels (the width thereof being 8 μm and the depth thereof being 1 μm) 22a and 23a in the portions corresponding to the stripes 52 and 53, respectively, as shown in FIG. 1(D). Since the sub-striped channels 22a and 23a are constituted by the current blocking layer 11 on the substrate 10, current does not flow therethrough. On the other hand, since the main striped channel 21 reaches the p-GaAs substrate 10, from which the current blocking layer 11 is removed, a current path is opened in this area. The current path is formed only in the main striped channel 21 which contributes to light emission, so that non-productive current which does not contribute to light emission can be reduced.

Thereafter, the remaining resist film 50 is removed, and a p-GaAlAs cladding layer 12 forming a heterojunction with an active layer as mentioned below, a GaAlAs active layer 13 for laser oscillation, an n-GaAlAs cladding layer 14 forming a heterojunction with the above-mentioned active layer 13, and an n+-GaAs cap layer 15 achieving an ohmic contact with an electrode are successively grown by liquid phase epitaxy, resulting in a double-heterostructure multi-layered crystal for laser oscillation.

Since the width of the sub-striped channels 22a and 23a is greater than that of the main striped channel 21, the portions of the p-cladding layer 12 corresponding to these sub-striped channels 22a and 23a is formed into a downward concave portion. The growth rate of the active layer 13 grown on the concaved portions of the p-cladding layer 12 is higher than that of the active layer 13 grown on the plane portion of the p-cladding layer 12. Thus As in the solution which comes into contact with the concaved portions of the p-cladding layer 12 is more quickly consumed for the growth of the active layer 13 than that in the solution in the surroundings of the concaved portions of the p-cladding layer 12. This results in the diffusion of As from the solution in the surroundings of the concaved p-cladding layer 12 into that in the concaved p-cladding layer 12, which causes a decrease in the concentration of As in the surroundings of the concaved p-cladding layer 12. Therefore, the growth of the active layer 13 in the surroundings of the concaved p-cladding layer 12 (i.e., in the plane portion of the p-cladding layer 12) is suppressed. That is, the concaved portions of the active layer 13 corresponding to the sub-striped channels 22a and 23a are formed with a great thickness, resulting in the suppression of the growth of the portion of the active layer 13 corresponding to the main striped channel 21 positioned between the sub-striped channels 22a and 23a. Because of the suppression of the growth of the active layer 13, the thickness of the active layer 13 becomes thin in the area corresponding to the main striped channel 21. In such a manner, the thickness of the active layer 13 can be easily controlled with reproducibility.

The thickness of the p-cladding layer 12 is, of course, controlled to be thin enough such that light within the active layer 13 can be absorbed in part at the substrate 10.

Figure 2A:
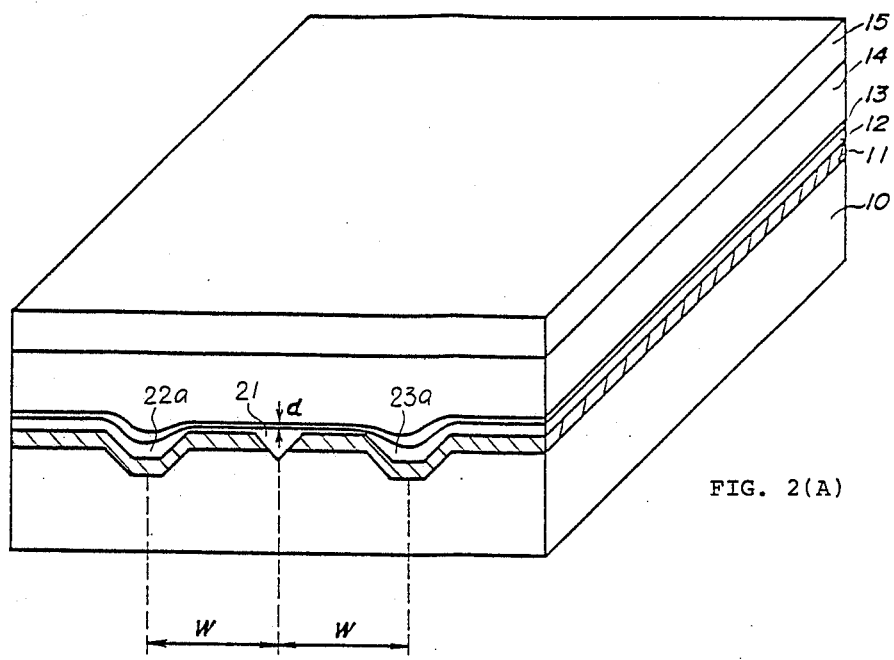
FIG. 2(A) is a perspective view showing the semiconductor laser device produced by the process shown in FIG. 1.
Figure 2B:
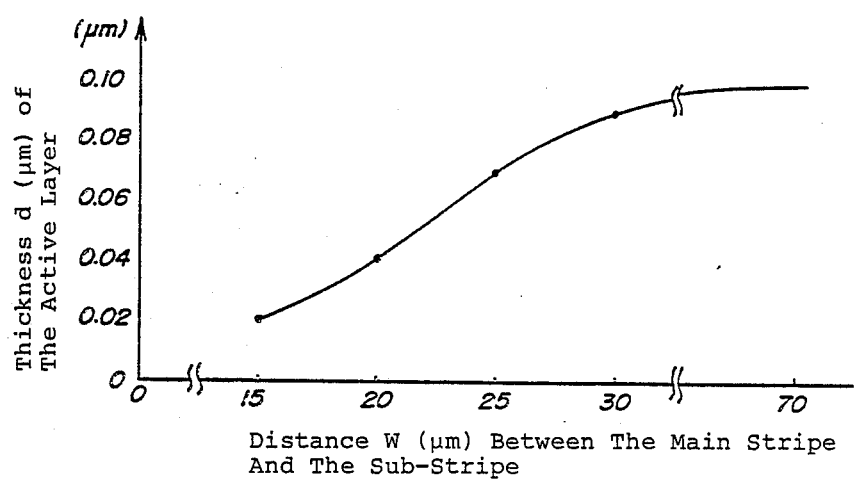
FIG. 2(B) is a graph showing the relationship between the distance between the main striped channel and the sub-striped channel and the thickness of the active layer of the semiconductor laser device shown in FIG. 2(A).

FIGS. 2(A) and 2(B) show the effect of the thinness of the active layer 13 on the lowering of the growth rate of the active layer 13 by changes in the distance W between the main striped channel 21 and each of the sub-striped channels 22a and 23a of the semiconductor laser device obtained by the above-mentioned process, wherein the width and the depth of the main striped channel 21 are 3 $\mu$m and 1 $\mu$m, respectively, and the width and the depth of each of the sub-striped channels 22a and 23a are 8 $\mu$m and 1 $\mu$m, respectively. The growth of the active layer was carried out at a supersaturation of 4° C. for 2 seconds. When the active layer 13 is grown by liquid phase epitaxy, the active layer 13 becomes thinner as the distance W becomes small. When the distance W becomes greater than approximately 70 $\mu$m, the effect of the sub-striped channels 22a and 23a on the thinness of the active layer 13 cannot be observed.

The p-sided electrode and the n-sided electrode are then formed on the above-mentioned double-heterostructure multi-layered crystal by a common method, and cleaved to form the facets, resulting in a semiconductor laser device unit, which can attain high output power operation two or three times as high as conventional semiconductor devices.

Although the sub-striped channel was formed at each of both sides of the main striped channel in the above-mentioned example, it can be formed at on side of the main striped channel or a plurality of the sub-striped channels can be formed at each of both sides thereof. As the semiconductor material, a GaAlInP system and other materials can also be used.

Example 2

Figure 3:
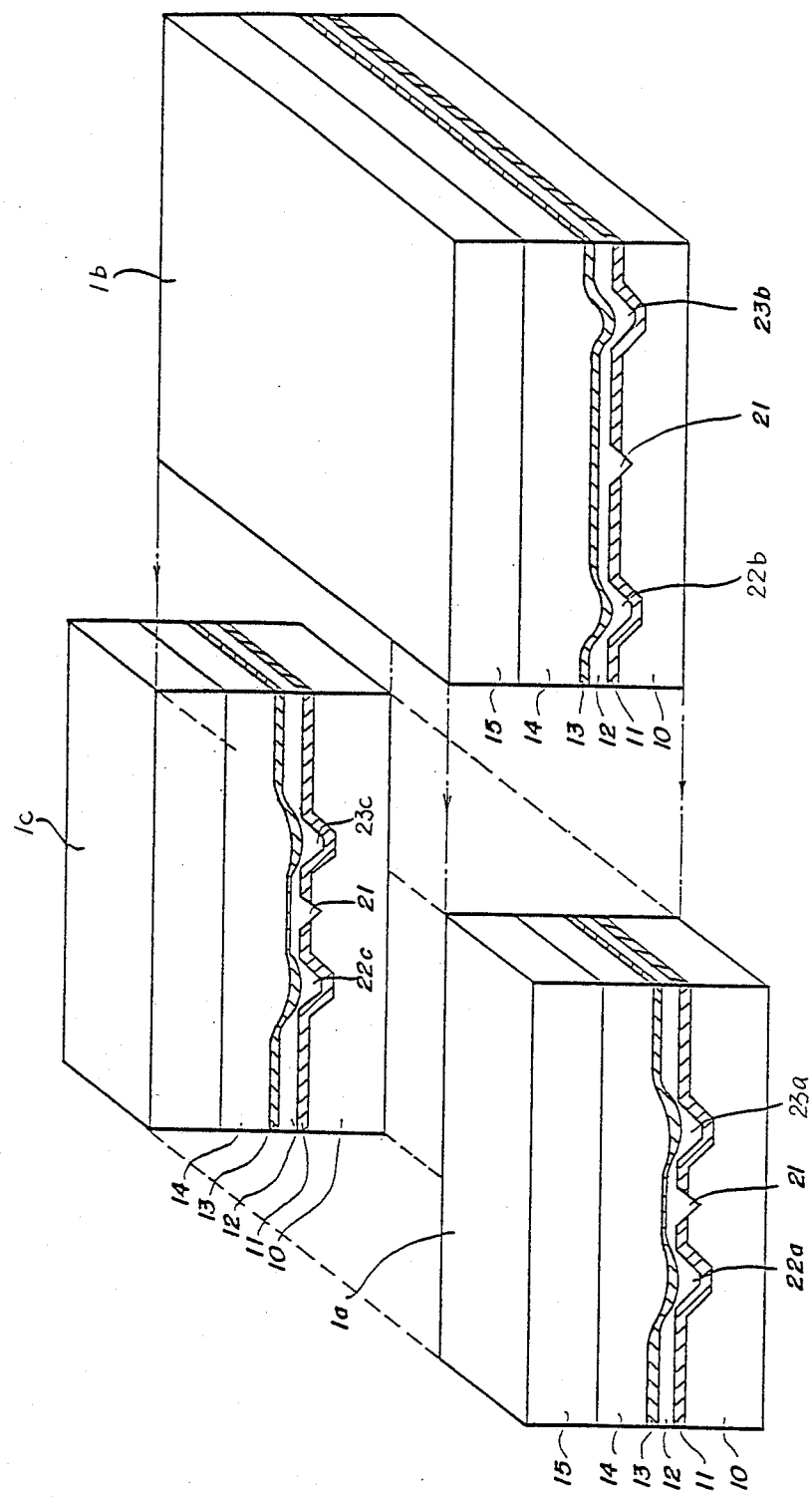
FIG. 3 is a perspective view showing another semiconductor laser device of this invention which is cut at the interface between each of the window regions and the light stimulated region.

FIG. 3 shows another semiconductor laser device of this invention which has an internal-cavity length of 250 $\mu$m and which comprises the window regions 1a and 1c having a length of 25 $\mu$m from the facets and the stimulated region 1b positioned between the window regions 1a and 1c. The structure of the semiconductor device is the same as that of the semiconductor device in Example 1 except that the distance between the main striped channel 21 and each of the sub-striped channels 22a, 23a, 22c, 23c in the window regions 1a and 1c is smaller than that between the main striped channel 21 and each of the sub-striped channels 22b and 23b in the stimulated region 1b. The upper surface of the p-cladding layer 12 is flat on the main striped channel 21, but it is downwardly concave on each of the sub-striped channels 22a, 23a, 22b, 23b, 22c, and 23c due to the shape of the sub-striped channels, and thus the active layer 13 grown on the concaved portions of the p-cladding layer 12 corresponding to the sub-striped channels 22a, 23a, 22c, and 23c are formed into a downward concave and the active layer 13 grown on the other portion of the p-cladding layer 12 is formed into a plane.

The thickness of the portions of the active layer 13 above the main striped channel 21 in the window regions 1a and 1c is thinner than that of the portion of the active layer 13 above the main striped channel 21 in the stimulated region 1b. The difference in the thickness of the active layer 13 therebetween arises for the following reason: The growth rate of the active layer 13 grown on the concaved portions of the p-cladding layer 12 corresponding to the sub-striped channels 22a, 23a, 22c, and 23c is higher than that of the active layer 13 grown on the plane portion of the p-cladding layer 12, resulting in the diffusion of As from the solution in the surroundings of the concaved p-cladding layer 12 into that in the concaved p-cladding layer 12, as described in Example 1, causing a decrease in the concentration of As in the surroundings of the concaved p-cladding layer 12 (i.e., in the portion of the active layer 13 corresponding to the main striped channel 21). Thus, the growth of the active layer 13 in the surroundings of the concaved p-cladding layer 12 is suppressed. The suppression of the growth of the active layer 13 depends upon the distance between the main striped channel and the sub-striped channel. Accordingly the growth of the active layer 13 in the window regions 1a and 1c becomes slower than that in the stimulated region 1b, resulting in a difference in the thickness of the active layer 13 between each of the window regions 1a and 1c and the stimulated region 1b. In this example, the distance between the main striped channel 21 and each of the sub-striped channels 22a, 23a, 22c, and 23c in the window regions 1a and 1c was 10 $\mu$m, the distance between the main striped channel 21 and each of the sub-striped channels 22b and 23b in the stimulated region 1b was 30 $\mu$m. Thus, the thickness of the active layer 13 corresponding to the main striped channel 21 in the window regions 1a and 1c can be thinner than that of the active layer 13 corresponding to the main striped channel 21 in the stimulated region 1b.

When current is applied to the above-mentioned semiconductor laser device, since the thickness of the active layer 13 in the window regions 1a and 1c is thinner than that of the active layer 13 in the stimulated region 1b, the injected electrons reach a conduction band at a higher level than that of the stimulated region 1b. Thus, this laser device functions as a window laser in which laser light oscillated in the stimulated regions 1b is not absorbed at the window regions 1a and 1c, thereby attaining high output power operation.

Figure 4A:
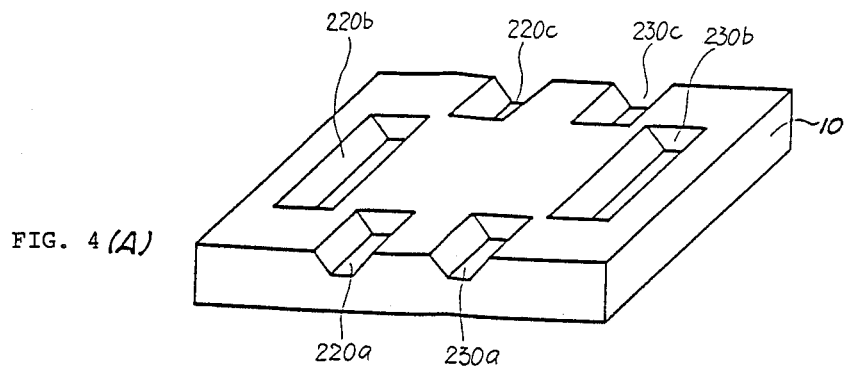
FIGS. 4(A) to 4(D) are perspective views showing a production process of the semiconductor laser device shown in FIG. 3.
Figure 4B:
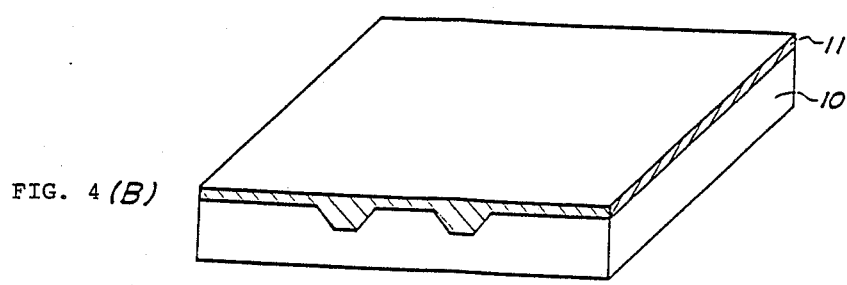
Figure 4:
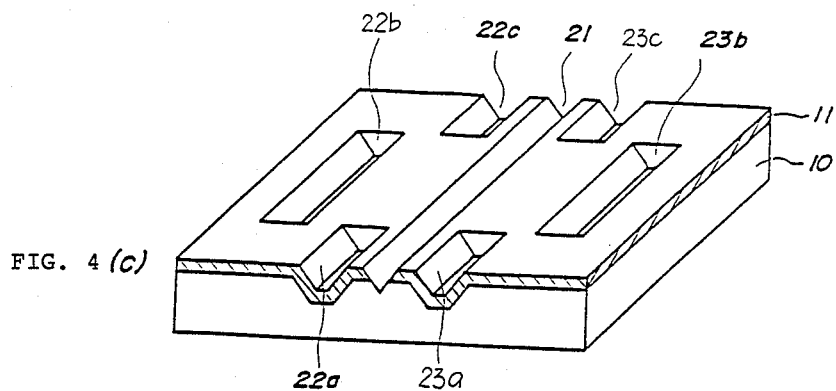
Figure 4:
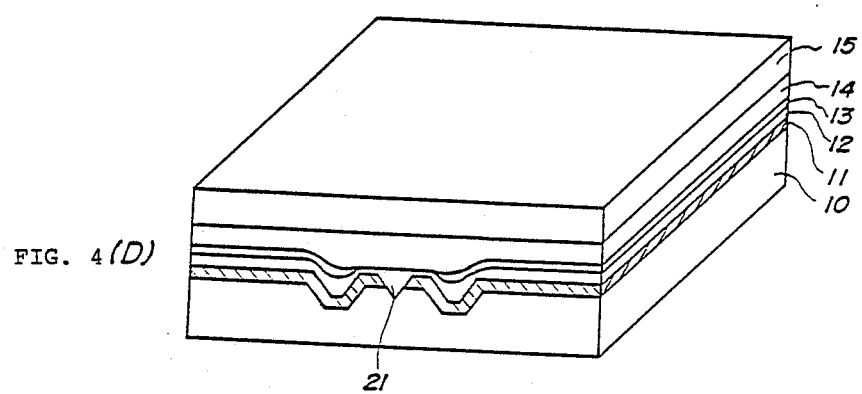

FIGS. 4(A) to 4(D) show a production process of the semiconductor laser device shown in FIG. 3. As shown in FIG. 4(A), on a Zn-doped p-GaAs substrate (p=1×10$^{19}$cm$^{-3}$) 10, striped channels 220a, 230a, 220b, 230b, 220c, and 230c with the same shape as and the same size as or a greater size than the sub-striped channels 22a, 23a, 22b, 23b, 22c, and 23c to be formed in the succeeding step are formed by an etching technique. Then, on the GaAs substrate 10, as shown in FIG. 4(B), a Te-doped n-GaAs current blocking layer (n=6×10$^{18}$cm$^{-3}$) 11 is grown by liquid phase epitaxy in such a manner that the striped channels 220a, 230a, 220b, 230b, 220c, and 230c are filled with the current blocking layer 11 having the flat surface, the thickness of which is 0.8 $\mu$m in the portion corresponding to the main striped channel 21 to be formed in the succeeding step. Then, as shown in FIG. 4(C), the sub-striped channels 22a, 23a, 22b, 23b, 22c, and 23c having a width of 8 $\mu$m and a depth of 1.0 $\mu$m are formed on the current blocking layer 11 corresponding to the striped channels 220a, 230a, 220b, 230b, 220c and 230c, respectively, by an etching technique. The main striped channel 21 has a width of 3 μm and a depth of 1.0 μm in the center portion between the sub-striped channels 22 (i.e., 22a, 22b and 22c) and 23 (i.e., 23a, 23b and 23c) by an etching technique in such a manner that it reaches the substrate 10, resulting in a current path therein. The sub-striped channels 22 do not constitute a current path since they do not contact the substrate 10 due to the current blocking layer 11. Thus, current flows through only the main striped channel 21, which serves to effectively confine the current therein.

Thereafter, as shown in FIG. 4(D), on the current blocking layer 11 including the main striped channel and the sub-striped channels, a p-GaAlAs cladding layer 12, a p-GaAlAs active layer 13, an n-GaAlAs cladding layer 14 and an n-GaAs cap layer 15 are successively grown by liquid phase epitaxy, resulting in a double-heterostructure multi-layered crystal for laser oscillation.

In this example, the thickness of the active layer 13 corresponding to the main striped channel 21 in the stimulated region 1b was about 0.10 μm, and that of the active layer 13 corresponding to the main striped channel 21 in each of the window regions 1a and 1c was about 0.04 μm. This results in a window semiconductor laser device which creates a high output power of 200 mW at the highest in continuous laser oscillation at room temperatures.

In this example, a p-GaAs semiconductor substrate was used, but is not limited thereto. An n-GaAs semiconductor substrate can be used. As the semiconductor material, an InGaAsP system, a GaAlAsSb system, etc., can, of course, be used.

Example 3

Figure 5:
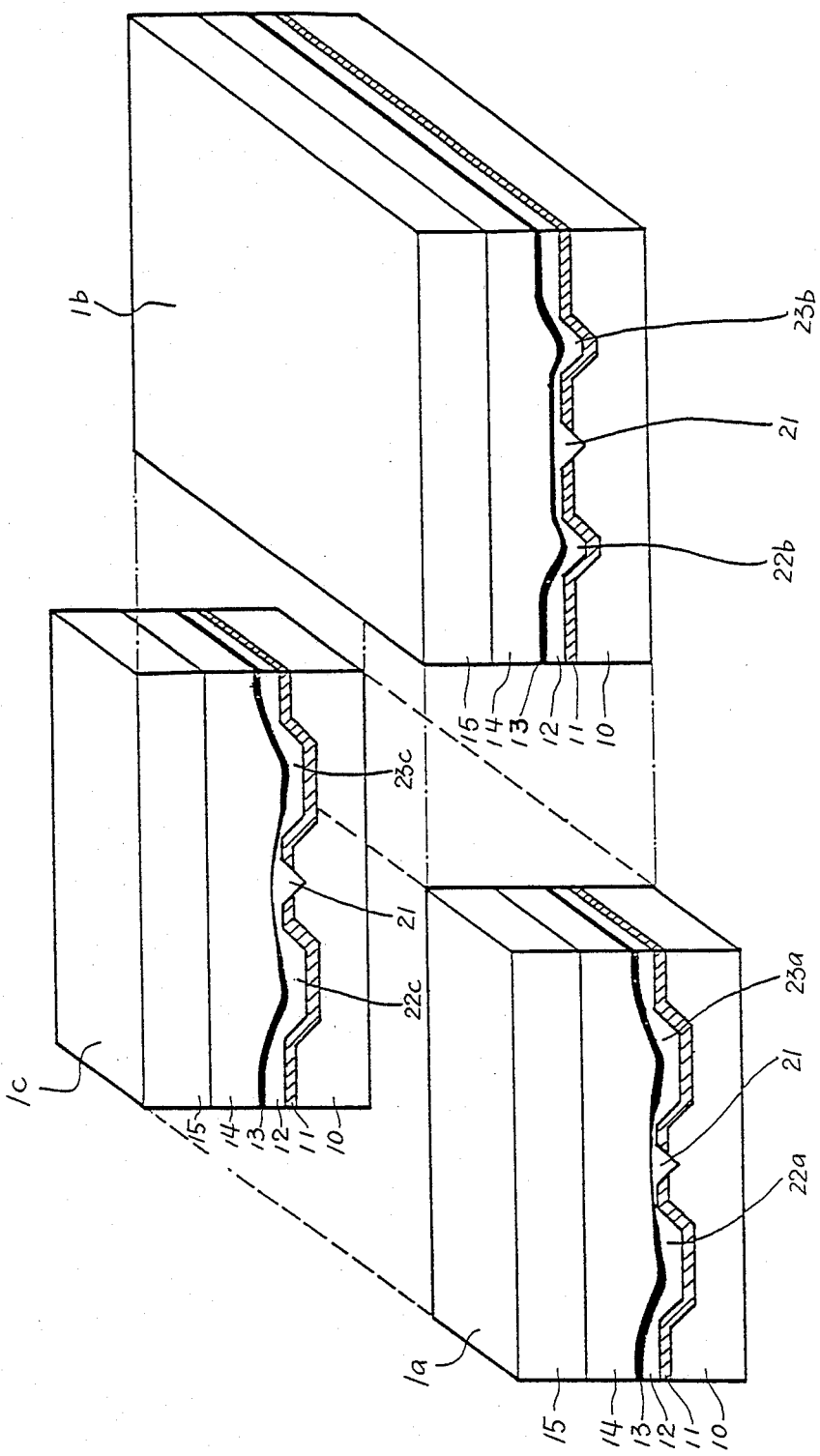
FIG. 5 is a perspective view showing another semiconductor laser device of this invention which is cut at the interface between each of the window regions and the light stimulated region.

FIG. 5 shows another semiconductor laser device of this invention, in which the internal-cavity length is approximately 250 μm. The thickness of the active layer 13 for laser oscillation operation in the window regions 1a and 1c each of which is formed with a length of 25 μm from the facet is thinner than that of the active layer 13 for laser oscillation operation in the stimulated region 1b. Thus the absorption of laser light at the window regions 1a and 1c can be suppressed. The portions of the active layer 13 corresponding to the sub-striped channels 22a, 23a, 22b, 23b, 22c and 23c positioned outside of the main striped channel 21 are formed into a concave-portion. The portion of the active layer 13 corresponding to the main striped channel 21 is formed into a plane. The growth rate of the plane portion of the active layer 13 depends upon the cross-sectional size and/or shape of the sub-striped channels 22a, 23a, 22c and 23c. That is, the thickness of the plane portion of the active layer 13 corresponding to the main striped channel 21 becomes thinner as the size of the cross section of the sub-striped channels 22a, 23a, 22c and 23c increases.

In the semiconductor laser device of this example, the width of the sub-striped channels 22a, 23a, 22c and 23c in the window regions 1a and 1c is greater than that of the sub-striped channels 22b and 23b in the stimulated region 1b, so that the thickness of the active layer 13 corresponding to the main striped channel 21 in the vicinity of the facets becomes thinner than that of the active layer 13 corresponding to the main striped channel inside of the facets. When current is applied to the device, since the thickness of the active layer 13 in the window regions 1a and 1c is thinner than that of the active layer 13 in the stimulated region 1b, the injected electrons reach a conduction band at a higher level than that of the stimulated region 1b. Thus, this laser device functions as a window laser in which laser light oscillated in the stimulated region 1b is not absorbed at the window regions 1a and 1c, thereby attaining high and stable output power operation.

Figure 6A:
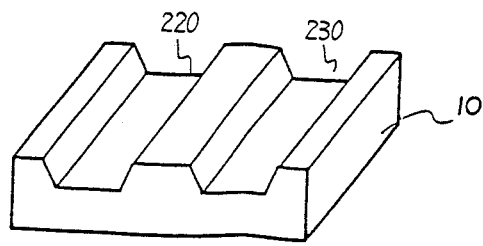
FIGS. 6(A) to 6(D) are perspective views showing a production process of the semiconductor laser device shown in FIG. 5.
Figure 6B:
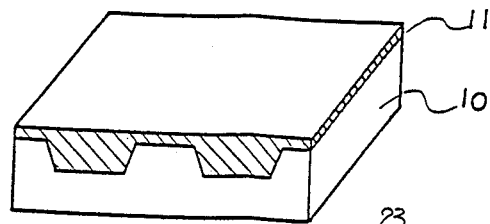
Figure 6C:
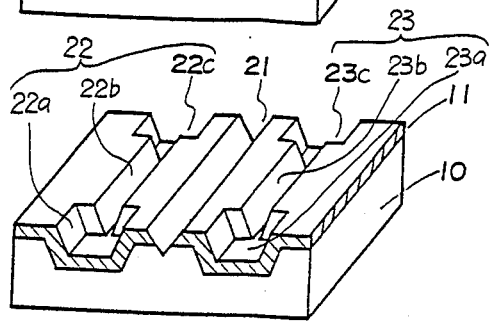

FIGS. 6(A) to 6(D) show a production process of the semiconductor laser device shown in FIG. 5. As shown in FIG. 6(A), on the portions of a p-GaAs substrate 10 corresponding to the sub-striped channels 22 and 23 to be formed in the succeeding step, a pair of channels 220 and 230 are formed by an etching technique. Then, as shown in FIG. 6(B), on the substrate 10, an n-GaAs current blocking layer 11 is grown by liquid phase epitaxy in such a manner that the channels 220 and 230 are filled with the current blocking layer 11, the thickness of which is 0.8 μm at the portion corresponding to the main striped channel 21 to be formed in the succeeding step. Then, as shown in FIG. 6(C), a pair of sub-striped channels 22 and 23 are formed corresponding to the pair of channels 220 and 230 by an etching technique in such a manner that the widths of the striped channels 22 and 23 in the window regions 1a and 1c and in the stimulated region 1b are 16 μm and 8 μm, respectively, and the depths thereof are 1 μm. Then, the main striped channel 21 having a width of 3 μm and a depth of 1 μm is formed in the center portion between the sub-striped channels 22 and 23. The main striped channel 21 reaches the p-GaAs substrate 10, resulting in a current path. Current required for laser oscillation flows only through the main striped channel 21.

Figure 6D:
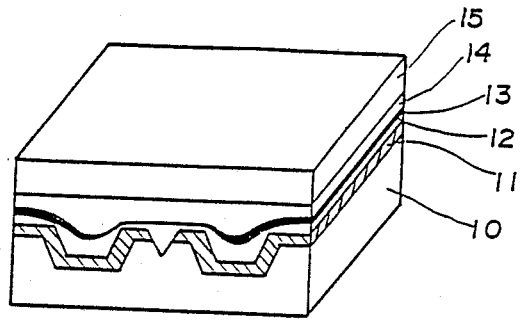

Thereafter, as shown in FIG. 6(D), on the current blocking layer 11 including channels 21, 22 and 23, a p-GaAlAs cladding layer 12, a p-GaAlAs active layer 13, an n-GaAlAs cladding layer 14 and an n-GaAs cap layer 15 are successively grown by liquid phase epitaxy, resulting in a double-heterostructure multilayered crystal for laser oscillation.

In the growth process, the portions of the active layer 13 corresponding to the sub-striped channels 22 and 23 are grown with a downward curvature, in which the consumption of the amount of solution is greater than that in the plane portion of the active layer 13 corresponding to the main striped channel 21. Thus the thickness of the plane portion of the active layer 13 positioned between the sub-striped channels 22 and 23 varies with the degree of the curvature of the concaved portions of the active layer 13. In order for the active layer 13 above the main striped channel 21 in the window regions 1a and 1c to be thinner than that of the active layer 13 above the main striped channel 21 in the stimulated region 1b, the width of the sub-striped channels 22a, 23a, 22c and 23c in the window regions 1a and 1c is wider than that of these sub-striped channels in the stimulated region 1b. In this example, the thickness of the active layer 13 above the main striped channel 21 in the stimulated region 1b is 0.08 μm, and that of the active layer 13 above the main striped channel 21 in the window regions 1a and 1c is 0.03 μm, resulting in a window laser in which the absorption of laser light at the window regions is suppressed, thereby attaining a high output power of 200 mW at the highest in continuous laser oscillation at room temperatures.

In the above-mentioned example, a p-GaAs semiconductor substrate was used, but is not limited thereto. An n-GaAs semiconductor material can be used for the substrate. Other semiconductor materials such as those from an InGaAsP system, an AlGaAsSb system, etc., can also be used therefor.

Example 4

Figure 7:
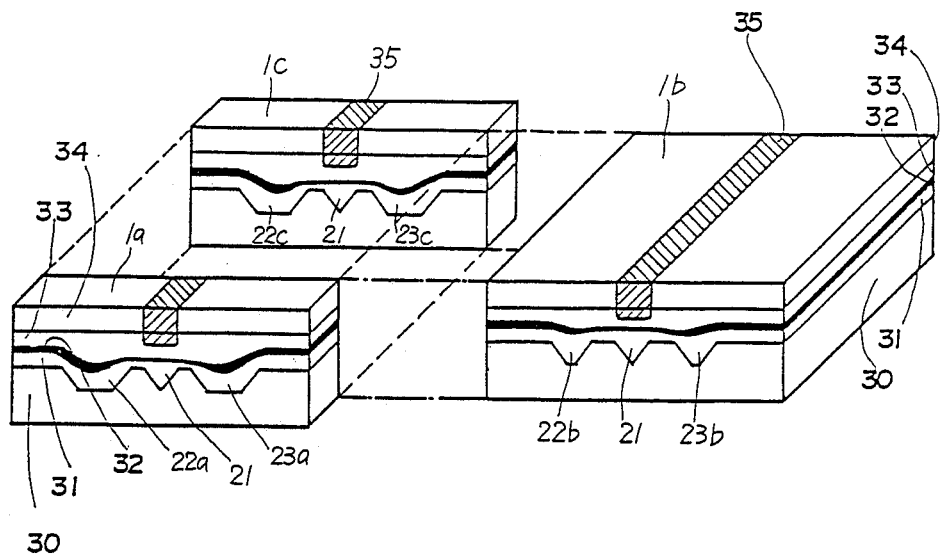
FIG. 7 is a perspective view showing another semiconductor laser device of this invention which is cut at the interface between each of the window regions and the light stimulated region.

FIG. 7 shows another semiconductor laser device of this invention, which is produced in the same manner as in Example 3 except that a striped structure is formed in the cap layer 34. This device is produced as follows: The striped channels 21, 22a, 23a, 22b, 23b, 22c and 23c are formed on the p-substrate 10 in the same manner as in Example 3, and then a p-cladding layer 31, a p-active layer 32, an n-cladding layer 33 and a p-cap layer (or a high ohmic contact) 34 are formed by liquid phase epitaxy, followed by diffusing n-impurities into the region of the p-cap layer 34 corresponding to the main striped channel to form an n-current path 35. The thickness of the active layer 32 above the main striped channel 21 in the window regions 1a and 1c is thinner than that of the active layer 32 above the main striped channel 21 in the stimulated region 1b. The main striped channel 21 of this example allows for the formation of an index guided waveguide in the active layer 32.

Example 5

Figure 8:
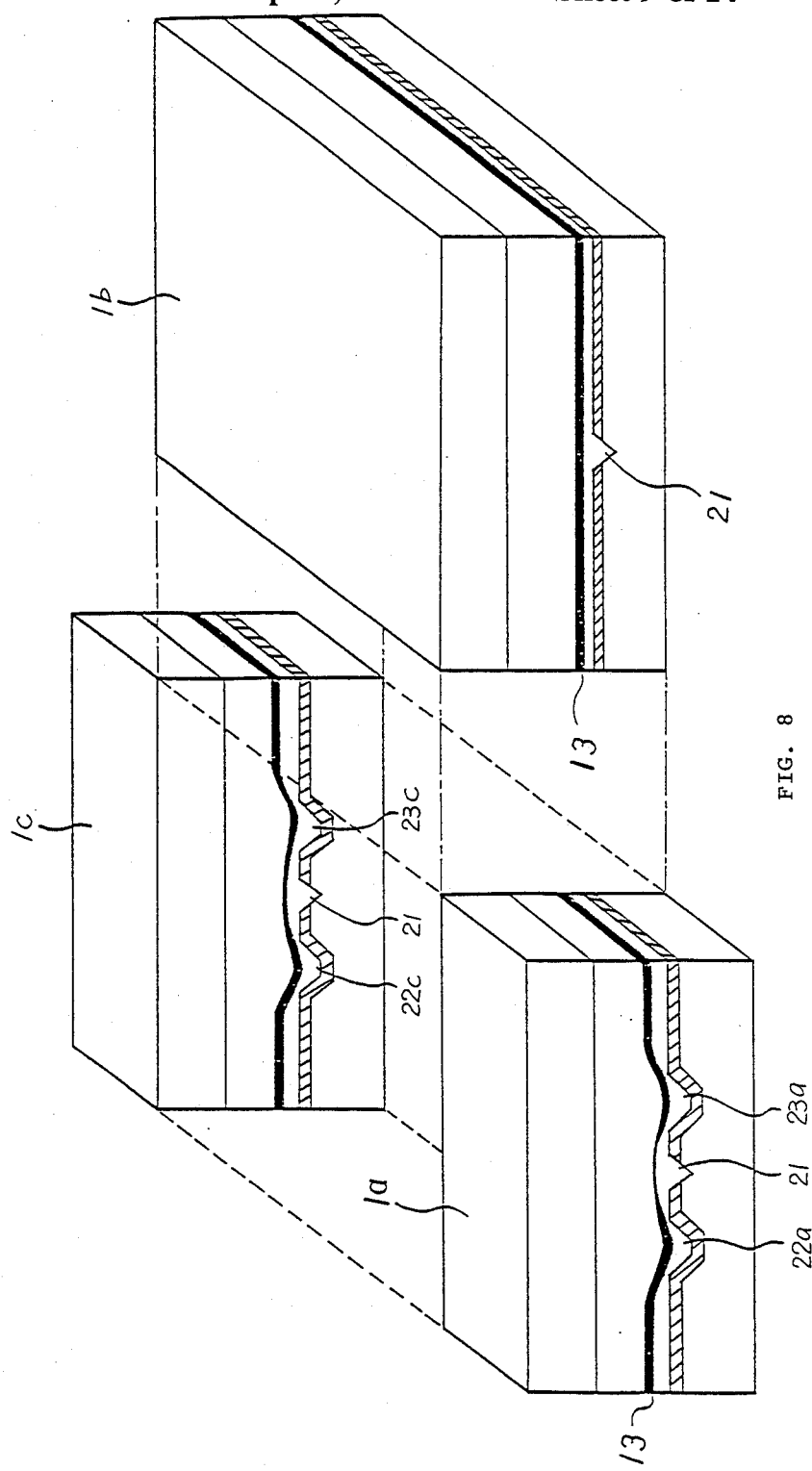
FIG. 8 is a perspective view showing another semiconductor laser device of this invention which is cut at the interface between each of the window regions and the light stimulated region.

FIG. 8 shows another semiconductor laser device of this invention which has a VSIS (V-channeled substrate inner stripe) structure. Its internal-cavity length is 250 $\mu$m, and the window regions 1a and 1c, respectively are formed with a length of 25 $\mu$m from the facets. The thickness of the active layer 13 above the main striped channel 21 in the window regions 1a and 1c is thinner than that of the active layer 13 above the main striped channel 21 in the stimulated region 1b inside of the facets. The difference in the thickness of the active layer 13 between each of the window regions 1a and 1c and the stimulated region 1b can be achieved by the formation of the sub-striped channels 22a, 23a, 22c and 23c outside of the main striped channel 21 in the window regions 1a and 1c. For the same reason, as described in Examples 1 and 2, the growth rate of the active layer 13 can be controlled by these sub-striped channels.

When current is applied to the above-mentioned semiconductor laser device, since the thickness of the active layer 13 above the main striped channel 21, which contributes to light emission, in the window regions 1a and 1c is thinner than that of the active layer 13 above the main striped channel 21 in the stimulated region 1b, the injected electrons reach a conduction band at a higher level than that of the stimulated region 1b. Thus, this laser device functions as a window laser in which laser light oscillated in the stimulated region 1b is not absorbed at the window regions 1a and 1c, thereby suppressing deterioration of the facets due to laser light and attaining high output power operation.

Figure 9:
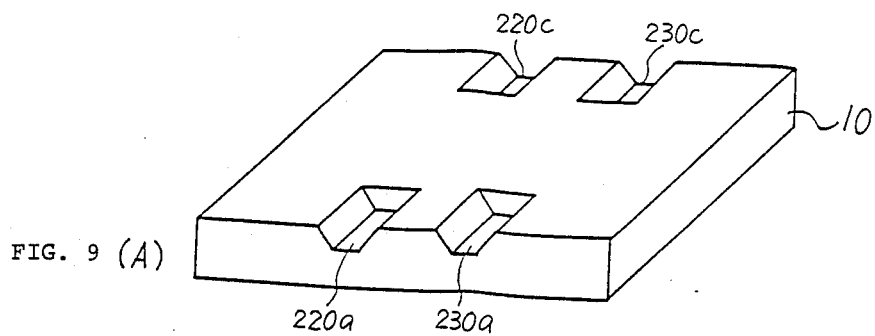
FIGS. 9(A) to 9(D) are perspective views showing a production process of the semiconductor laser device shown in FIG. 8.
Figure 9:
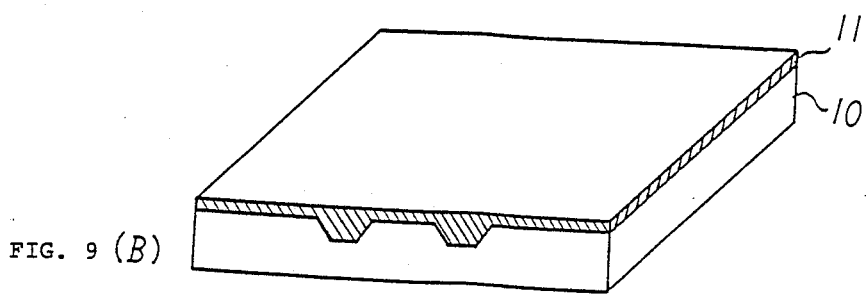
Figure 9:
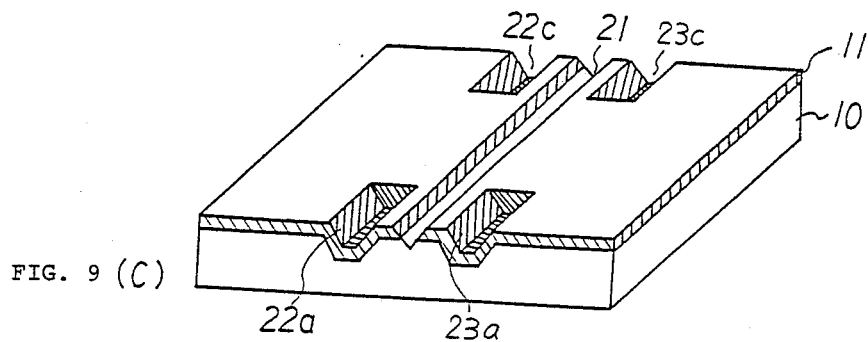
Figure 9:
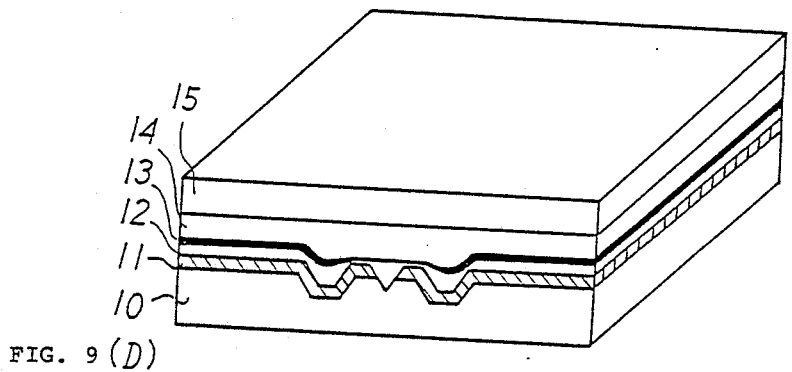

FIGS. 9(A) to 9(D) show a production process of the semiconductor laser device shown in FIG. 8. As shown in FIG. 9(A), on the end portions of a Zn-doped p-GaAs substrate (p=1×10$^{19}$cm$^{-3}$) 10 corresponding to the sub-striped channels 22a, 23a, 22c and 23c to be formed in the succeeding step, striped channels 220a, 230a, 220c and 230c which are slightly larger than the sub-striped channels 22a, 23a, 22c and 23c are formed by an etching technique. Then, as shown in FIG. 9(B), on the substrate 10, a Te-doped n-GaAs current blocking layer (n=6×10$^{18}$cm$^{-3}$) 11 is grown by liquid phase epitaxy in such a manner that the striped channels 220a, 230a, 220c and 230c are filled with the current blocking layer 11. The thickness of the blocking layer 11 is 0.8 $\mu$m at the portions corresponding to the main striped channel 21 to be formed in the succeeding step. Then, as shown in FIG. 9(C), the sub-striped channels 22a, 23a, 22c and 23c having a width of 8 $\mu$m and a depth of 1 $\mu$m are formed corresponding to the striped channels 220a, 230a, 220c and 230c of the substrate 10 by an etching technique. The main striped channel 21 having a width of 3 $\mu$m and a depth of 1 $\mu$m is then formed from one end of the substrate 10 to the other end thereof in the center portion between the sub-striped channels 22 (i.e., 22a and 22c) and 23 (i.e., 23a and 23c) by an etching technique. The main striped channel 21 reaches the p-GaAs substrate 10, resulting in a striped current path therein, but current does not pass through sub-striped channels 22a, 23a, 22c and 23c due to the current blocking layer 11.

Thereafter, as shown in FIG. 9(D), on the current blocking layer 11 including the striped channels 21, 22 and 23, a p-GaAlAs cladding layer 12, a p-GaAlAs active layer 13, an n-GaAlAs cladding layer 14 and an n-GaAs cap layer 15 are successively grown by liquid phase epitaxy, resulting in a double-heterostructure multi-layered crystal for laser oscillation.

In the growth process, the p-cladding layer 12 is, of course, formed into a concave corresponding to the sub-striped channels 22a, 23a, 22c and 23c and into a plane corresponding to the main striped channel 21, such that the active layer 13 can be formed with a downward curvature on the portions of the p-cladding layer 12 corresponding to the sub-striped channels 22a, 23a, 22c and 23c. Thus, for the afore-mentioned reasons, the thickness (e.g., 0.04 $\mu$m) of the active layer 13 above the main striped channel 21 in the window regions 1a and 1c becomes thinner than that (e.g., 0.1 $\mu$m) of the active layer 13 above the main striped channel 21 in the stimulated region 1b. Since current is confined within the main striped channel 21, the region of the active layer 13 corresponding to the main striped channel 21 constitutes an index guided laser oscillation area.

The semiconductor laser device obtained in this example creates a high output power of 200 mW or more in a continuous laser oscillation at room temperatures.

In the above-mentioned example, the growth of a multi-layered crystal on the p-GaAs substrate was described, but is not limited thereto. The growth thereof on a semiconductor substrate having a different polarity can also be achieved. Other semiconductor materials such as those from a GaAsInP system, a GaAlAsSb system, etc., can be used.

Example 6

Figure 10:
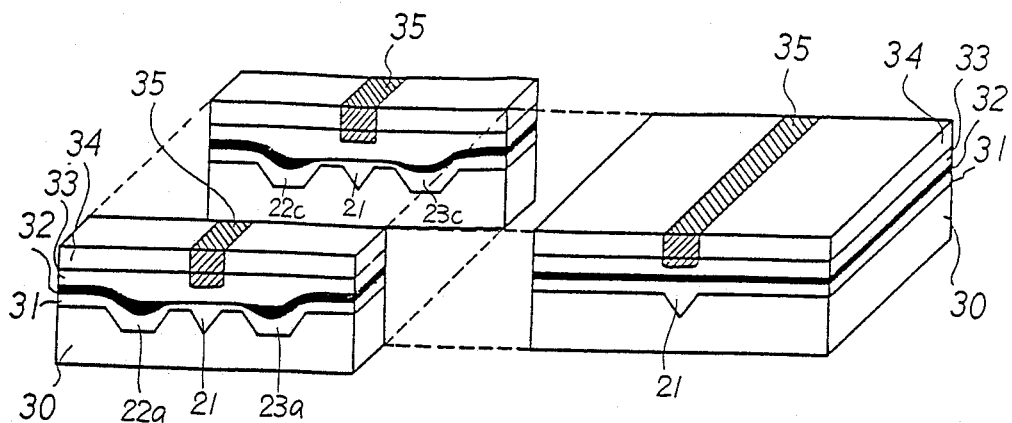
FIG. 10 is a perspective view showing another semiconductor laser device of this invention which is cut at the interface between each of the window regions and the light stimulated region.

FIG. 10 shows another semiconductor laser device of this invention, which is produced in the same manner as in Example 5 except that a striped structure is formed in the cap layer 34. This device is produced as follows: The main striped channel 21 and the sub-striped channels 22a, 23a, 22c and 23c are formed on a p-GaAs substrate 30 in the same manner as in Example 5, and then on the substrate 30, a p-GaAlAs cladding layer 31, a p-GaAlAs active layer 32, an n-GaAlAs cladding layer 33 and a p-GaAs cap layer 34 are successively formed by liquid phase epitaxy, resulting in a multi-layered crystal structure for laser oscillation. Then, n-impurities are diffused into the region of the cap layer 34 corresponding to the main striped channel 21 to form a current path of a striped n-diffusion layer 35. The main striped channel 21 gives rise to the distribution of light intensities based on the exudation of light within the active layer 32, resulting in an index guided structure. Laser oscillation is achieved in the region of the active layer 32 positioned between the main striped channel 21 and n-diffusion layer 35.

Example 7

Figure 11:
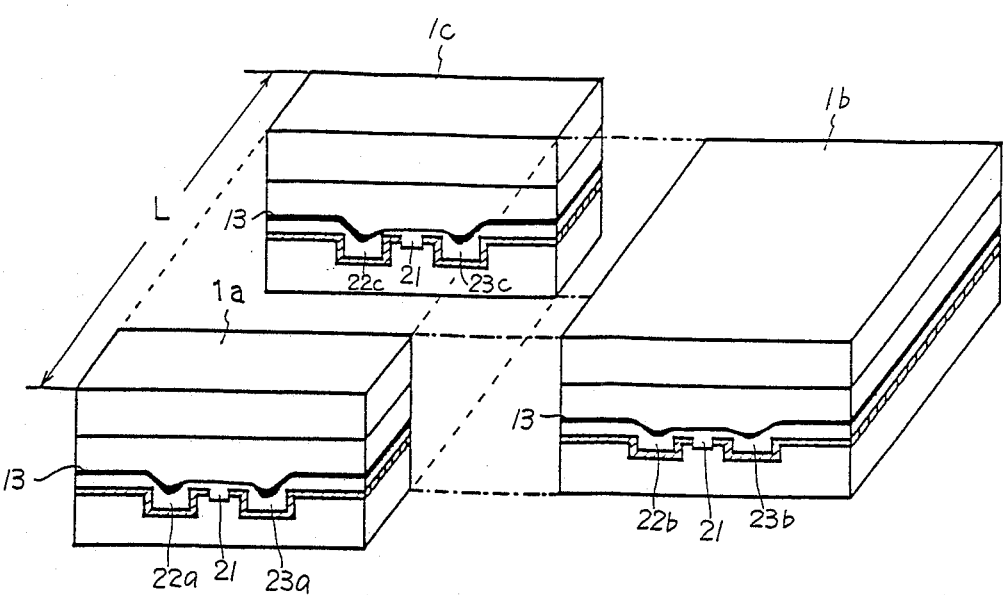
FIG. 11 is a perspective view showing another semiconductor laser device of this invention which is cut at the interface between each of the window regions and the light stimulated region.

FIG. 11 shows another semiconductor laser device of this invention having an internal-cavity length of 250 μm, which comprises the window regions 1a and 1c with a length of 25 μm from the facets and the stimulated region 1b positioned between the window regions 1a and 1c. The thickness of the active layer 13 above the main striped channel 21 in the window regions 1a and 1c is thinner than that of the active layer 13 above the main striped channel 21 in the stimulated region 1b. The difference in the thickness of the active layer 13 between each of the window regions 1a and 1c and the stimulated region 1b results from the difference in the depth between the sub-striped channels 22a and 22b, 22b and 22c, 23a and 23b, and 23b and 23c. The depth of the sub-striped channels 22b and 23b in the stimulated region 1b is 1.5 μm, while that of the sub-striped channels 22a, 23a, 22c and 23c in the window regions 1a and 1c is approximately 2.5 μm. For the same reasons as described in Examples 1 and 2, As in the solution in the deeply concaved cladding layer is more quickly consumed for the growth of the active layer than that in the slightly concaved cladding layer. This results in the suppression of the growth of the active layer in the surroundings of the deeply concaved cladding layer. Thus, the thickness of the active layer 13 above the main striped channel 21 in the window regions 1a and 1c becomes thinner than that of the active layer 13 above the main striped channel 21 in the stimulated region 1b.

When current is applied to the above-mentioned semiconductor laser device, since the thickness of the active layer 13 of the laser oscillation operation area in the window regions 1a and 1c is thinner than that of the active layer 13 of the laser oscillation operation area in the stimulated region 1b, the injected electrons reach a conduction band at a higher level than that of the stimulated region 1b. Thus, this laser device functions as a window laser in which laser light oscillated in stimulated region 1b is not absorbed at the window regions 1a and 1c, thereby attaining high output power operation.

Figure 12A:
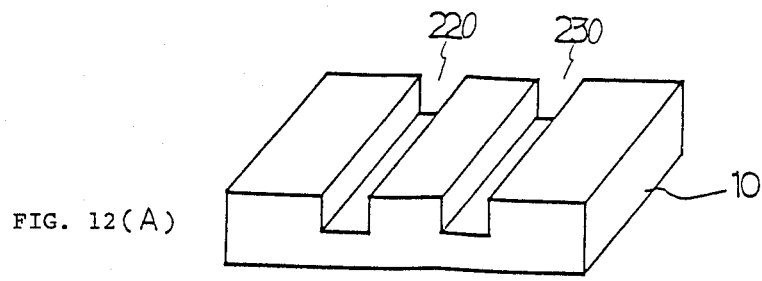
FIGS. 12(A) to 12(D) are perspective views showing a production process of the semiconductor laser device shown in FIG. 11.
Figure 12B:
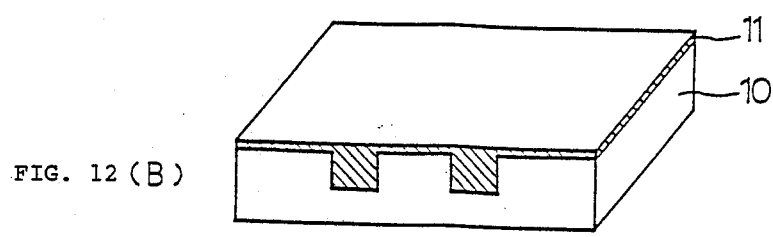
Figure 12C:
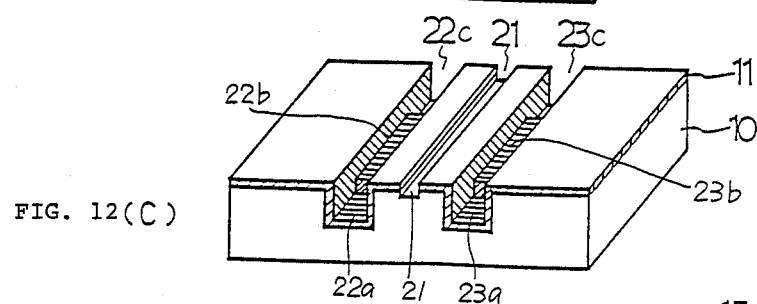

FIGS. 12(A) to 12(D) show a production process of the semiconductor laser device shown in FIG. 11. As shown in FIG. 12(A), on the portions of a p-GaAs substrate 10 corresponding to the sub-striped channels 22a, 23a, 22b, 23b, 22c and 23c to be formed in the succeeding step, striped channels 220 and 230 which are wider and deeper than the sub-striped channels 22a, 23a, 22c and 23c are formed into a rectangle with a width of 10 μm and a depth of 3 μm by an etching technique. Then, as shown in FIG. 12(B), on the substrate 10, an n-GaAs current blocking layer 11 is grown by liquid phase epitaxy in such a manner that the striped channels 220 and 230 are filled with the current blocking layer 11, the thickness of which is 0.8 μm at the portion corresponding to the main striped channel 21 to be formed in the succeeding step. Then, as shown in FIG. 12(C), using an etching technique, the sub-striped channels 22a, 23a, 22c and 23c having a width of 8 μm and a depth of 2.5 μm are formed in the window regions 1a and 1c and the sub-striped channels 22b and 23b having a width of 8 μm and a depth of 1.5 μm are formed in the stimulated region 1b. Then, the main striped channel 21 having a width of 3 μm and a depth of 1 μm is formed in the center portion between the sub-striped channels 22 (i.e., 22a, 22b and 22c) and 23 (i.e., 23a, 23b and 23c) by an etching technique. The main striped channel 21 reaches the GaAs substrate 10, resulting in a current path, while current does not pass through the sub-striped channels 22 and 23 due to the current blocking layer 11. Thus, current flows only through the main striped channel 21, so that occurrence of non-productive current which does not contribute to light emission can be suppressed.

Figure 12D:
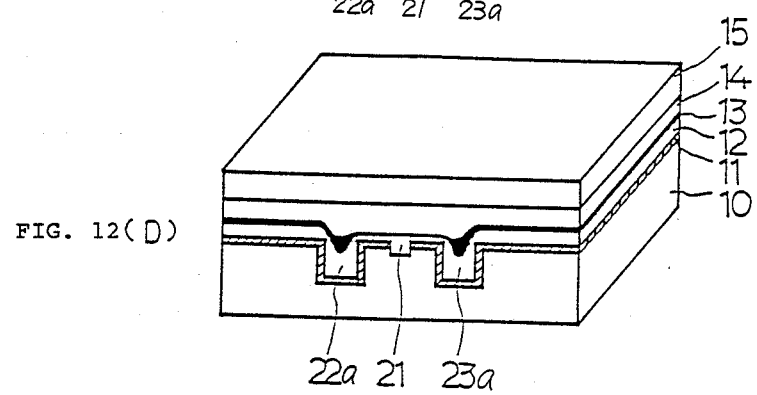

Thereafter, as shown in FIG. 12(D), on the current blocking layer 11 including the channels 21, 22 and 23, a p-GaAlAs cladding layer 12, a p-GaAlAs active layer 13, an n-GaAlAs cladding layer 14 and an n-cap layer 15 are successively grown by liquid phase epitaxy, resulting in a double-heterostructure multi-layered crystal for laser oscillation.

In the growth process, the p-cladding layer 12 is, of course, formed into a concave corresponding to the sub-striped channels 22a, 23a, 22b, 23b, 22c and 23c which are wider and deeper than the main striped channel 21 and into a plane corresponding to the main striped channel 21, such that the active layer 13 can be formed with a downward curvature on the concaved portions of the p-cladding layer 12 above the sub-striped channels 22a, 23a, 22b, 23b, 22c and 23c. Thus, for the afore-mentioned reasons, the thickness of the active layer 13 above the main striped channel 21 in the window regions 1a and 1c becomes thinner than that of the active layer 13 above the main striped channel 21 in the stimulated region 1b, depending upon the degree of the curvature of the active layer 13 above the sub-striped channels 22a, 23a, 22b, 23b, 22c and 23c.

In this example, the thickness of the active layer 13 above the main striped channel 21 in the stimulated region 1b was 0.08 μm and that of the active layer 13 above the main striped channel 21 in the window regions 1a and 1c was 0.03 μm. The resulting device attained a high output power of 200 mW or more in continuous laser oscillation at room temperatures.

In the above-mentioned example, the growth of crystals on the p-GaAs semiconductor substrate was carried out, but is not limited thereto. A device structure having an opposite polarity can be applied to this invention. Other semiconductor materials such as those from an InGaAsP system, an AlGaAsSb system, etc., can also be used.

Example 8

Figure 13:
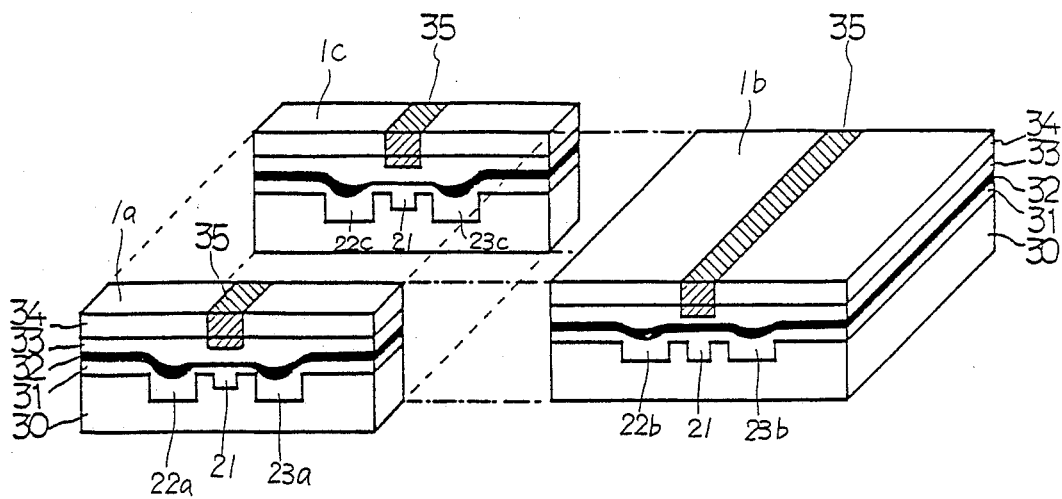
FIG. 13 is a perspective view showing another semiconductor laser device of this invention which is cut at the interface between each of the window regions and the light stimulated region.

FIG. 13 shows another semiconductor laser device of this invention, which is produced in the same manner as in Example 7 except that a striped structure is formed in the cap layer 34. This device is produced as follows: The main striped channel 21 and the sub-striped channels 22a, 23a, 22b, 23b, 22c and 23c are formed on an n-GaAs substrate 30 in the same manner as in Example 7, and then on the substrate 30, an n-GaAlAs cladding layer 31, a non-doped GaAlAs active layer 32, a p-GaAlAs cladding layer 33 and an n-GaAs cap layer 34 are successively formed by liquid phase epitaxy. This results in a multi-layered crystal structure for laser oscillation. Then, Zn is diffused into the region of the cap layer 34 corresponding to the main striped channel 21 to form a current path of a striped p-diffusion region 35 in which current is confined. Thus, laser oscillation is achieved in the region of the active layer 32 positioned between the p-diffusion region 35 and the main striped channel 21. The thickness of the active layer 32 of the laser oscillation area in the window regions 1a and 1c is thinner than that of the active layer 32 of the laser oscillation area in the stimulated region 1b, resulting in a window laser in which the absorption of laser light is suppressed.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser device comprising a substrate having a main striped channel for confining current therein and sub-striped channels formed in a parallel manner outside of said main striped channel, a width of said sub-striped channels being greater than that of said main striped channel, and an active layer for laser oscillation, whereby portions of said active layer corresponding to said sub-striped channels are formed into a concave, and a portion of said active layer positioned between said concaved portions of said active layer results in a plane with a limited thickness, wherein the improvement comprises said thickness of said portion of said active layer positioned between said concaved portions of said active layer being thinner than that of the other portions of said active layer.

2. A semiconductor laser device according to claim 1, wherein said semiconductor laser device is a window type semiconductor layer device and wherein said thickness of said portions of said active layer corresponding to said main striped channel in a vicinity of facets is thinner than that of said portion of said active layer corresponding to said main striped channel inside of said facets.

3. A semiconductor laser device according to claim 2, wherein said sub-striped channels are formed in a direction of laser oscillation along a whole length of said main striped channel, a distance between said main striped channel and each of said sub-striped channels in said vicinity of said facets being smaller than that between said main striped channel and each of said sub-striped channels inside of said facets.

4. A semiconductor laser device according to claim 2, wherein said sub-striped channels are formed in said direction of laser oscillation along said main striped channel only in said vicinity of said facets.

5. A semiconductor laser device according to claim 2, wherein said width of each of said sub-striped channels is wider in said vicinity of said facets than that of each of said sub-striped channels inside of said facets.

6. A semiconductor laser device according to claim 2, wherein a depth of each of said sub-striped channels is deeper in said vicinity of said facets than that of each of said sub-striped channels inside of said facets.

7. A semiconductor laser device according to any one of the preceding claims 2 to 6, wherein said portion of the active layer in said vicinity of each of said facets is a window region functioning as an optical waveguide.

* * * * *